United States Patent
Lu et al.

(10) Patent No.: US 8,638,589 B2
(45) Date of Patent: Jan. 28, 2014

(54) OPERATING METHOD FOR NON-VOLATILE MEMORY UNIT

(75) Inventors: Hau-Yan Lu, Kaohsiung (TW); Hsin-Ming Chen, Hsinchu (TW); Ching-Sung Yang, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 13/366,370

(22) Filed: Feb. 6, 2012

(65) Prior Publication Data

US 2012/0134205 A1 May 31, 2012

Related U.S. Application Data

(63) Continuation-in-part of application No. 12/633,780, filed on Dec. 8, 2009, now Pat. No. 8,174,063.

(60) Provisional application No. 61/230,099, filed on Jul. 30, 2009.

(51) Int. Cl.
*G11C 17/00* (2006.01)
*G11C 17/18* (2006.01)
*G11C 16/04* (2006.01)
*H01L 29/788* (2006.01)
*H01L 29/66* (2006.01)
*H01L 23/52* (2006.01)

(52) U.S. Cl.
USPC ..... 365/96; 365/104; 365/185.01; 365/225.7; 257/317; 257/319; 257/530; 257/E21.592; 257/E23.147

(58) Field of Classification Search
USPC .......................................................... 365/96
See application file for complete search history.

(56) References Cited

U.S. PATENT DOCUMENTS

| | | | |
|---|---|---|---|
| 6,956,258 B2 * | 10/2005 | Peng | 257/298 |
| 7,227,234 B2 | 6/2007 | Roizin et al. | |
| 7,294,888 B1 | 11/2007 | Paak et al. | |
| 7,456,465 B2 | 11/2008 | Prinz et al. | |
| 7,525,145 B2 * | 4/2009 | Shukuri | 257/311 |
| 7,532,496 B1 * | 5/2009 | Bu | 365/94 |
| 7,623,368 B2 * | 11/2009 | Luan | 365/104 |
| 7,811,886 B2 | 10/2010 | Winstead et al. | |
| 8,031,506 B2 * | 10/2011 | Schmitt et al. | 365/96 |
| 8,283,751 B2 * | 10/2012 | Kurjanowicz | 257/530 |
| 8,344,445 B2 * | 1/2013 | Lu et al. | 257/324 |
| 2006/0008992 A1 | 1/2006 | Shukuri | |
| 2008/0188052 A1 | 8/2008 | Winstead et al. | |
| 2009/0085127 A1 * | 4/2009 | Liu et al. | 257/393 |
| 2010/0244120 A1 | 9/2010 | Kang et al. | |

\* cited by examiner

*Primary Examiner* — Son Mai
(74) *Attorney, Agent, or Firm* — Jianq Chyun IP Office

(57) ABSTRACT

An operating method for a memory unit is provided, wherein the memory unit includes a well region, a select gate, a first gate, a second gate, an oxide nitride spacer, a first diffusion region, and a second diffusion region. The operating method for the memory unit comprises the following steps. During a programming operation, a breakdown voltage is coupled to the second diffusion region through a first channel region formed under the select gate. A programming voltage is sequentially or simultaneously applied to the first gate and the second gate to rupture a first oxide layer and a second oxide layer, wherein the first oxide layer is disposed between the first gate and the well region, and the second oxide layer is disposed between the second gate and the well region.

12 Claims, 11 Drawing Sheets

OPERATING METHOD FOR NON-VOLATILE MEMORY UNIT

CROSS-REFERENCE TO RELATED APPLICATION

This application is a continuation-in-part of and claims the priority benefit of U.S. application Ser. No. 12/633,780, filed on Dec. 8, 2009, and the U.S. application Ser. No. 12/633,780 claims the priority benefit of U.S. provisional application Ser. No. 61/230,099, filed on Jul. 30, 2009. The entirety of each of the above-mentioned patent applications is hereby incorporated by reference herein and made a part of this specification.

BACKGROUND OF THE INVENTION

1. Field of the Invention

The invention generally relates to an operating method for a memory unit, in particular, to an operating method for a non-volatile memory unit.

2. Description of Related Art

A non-volatile memory is a type of memory that retains information it stores even when no power is supplied to memory blocks thereof. The non-volatile memory may be classified into a read only memory (ROM), a one time programming ROM (OTP ROM), and a memory for multiple read and programming. Besides, as the fabrication process improves, the non-volatile memory could be implemented with the same process as a complementary metal oxide semiconductor (CMOS) device.

As the OTP ROM described above, the OTP ROM may be classified into a fuse type and an anti-fuse type. The fuse type OTP ROM is short before the fuse type OTP ROM is programmed, and it becomes open after being programmed. In the contrary, the anti-fuse type OTP ROM is open before being programmed, and it becomes short after being programmed. Besides, based on the fabrication process characteristic of the metal oxide semiconductor (MOS) device, the anti-fuse OTP ROM is fit to be implemented with the CMOS fabrication process.

Besides, a programming operation of the OTP ROM unit is based on the breakdown of the oxide layer of the gate to form a permanent conductance channel. Furthermore, the formed location of the permanent conductance channel will change with the variation of the processes. Therefore, an operating method of the OTP ROM unit now usually results in erroneous judgments and higher power consumption because of the different formed location of the conductance channel.

SUMMARY OF THE INVENTION

Accordingly, the present invention is directed to an operating method for a one time programming memory unit to increase the success probability of the programming operation, and further to decrease the power consumption of the memory unit while reading.

The present invention provides an operating method for a memory unit. The memory unit includes a well region, a select gate, a first gate, a second gate, an oxide nitride spacer, a first diffusion region, and a second diffusion region. The well region includes an active region. The select gate is formed fully on the active region. The first gate and the second gate are formed partially on the active region at a first side of the select gate. The oxide nitride spacer is filled between the first gate and the second gate. The first diffusion region is formed at the first side of the select gate, and the second diffusion region is formed at a second side of the select gate.

The operating method for the memory unit includes the following steps: during a programming operation, coupling a breakdown voltage to the second diffusion region through a first channel region formed under the select gate, and applying a programming voltage to the first gate and the second gate sequentially or simultaneously to rupture a first oxide layer and a second oxide layer, wherein the first oxide layer is disposed between the first gate and the well region, and the second oxide layer is disposed between the second gate and the well region.

According to an embodiment of the present invention, the step of coupling the breakdown voltage to the second diffusion region through the first channel region, which is formed under the select gate includes the following steps: applying a first word line voltage to the select gate to form the first channel region, and applying a bit line voltage to the first diffusion region.

According to an embodiment of the present invention, the step of applying the programming voltage to the first gate and the second gate sequentially includes the following steps: during a first period of the programming operation, applying the programming voltage to the first gate and floating the second gate, and during a second period of the programming operation, applying the programming voltage to the second gate and floating the first gate.

According to an embodiment of the present invention, the operating method for the memory unit further includes the following steps: during a first period of a read operation, reading a first current through a second channel region under the select gate and the first gate and determining a state of the memory unit according to the first current, and during a second period of the read operation, reading a second current through a third channel region under the select gate and the second gate and determining the state of the memory unit according to the second current.

According to an embodiment of the present invention, the step of reading the first current through the second channel region under the select gate and the first gate includes the following steps: applying a bit line voltage to the first diffusion region, applying a second word line voltage to the select gate, and applying a reading voltage to the first gate.

According to an embodiment of the present invention, the step of reading the second current through the third channel region under the select gate and the second gate includes the following steps: applying a bit line voltage to the first diffusion region, applying a second word line voltage to the select gate, and applying a reading voltage to the second gate.

As described above, the present invention operates one time programming by rupturing an oxide layer. In addition, the invention may rupture two oxide layers sequentially or simultaneously, so two memory cells may be used to store a state of a memory unit. Then, the invention increases the success probability of the programming operation of the memory unit, and decreases the erroneous judgments of the read operation of the memory unit.

Thus, the invention increases the success probability of programming operation, decreases the power consumption of read operation, and determines the state of the memory unit during a period of read operation.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
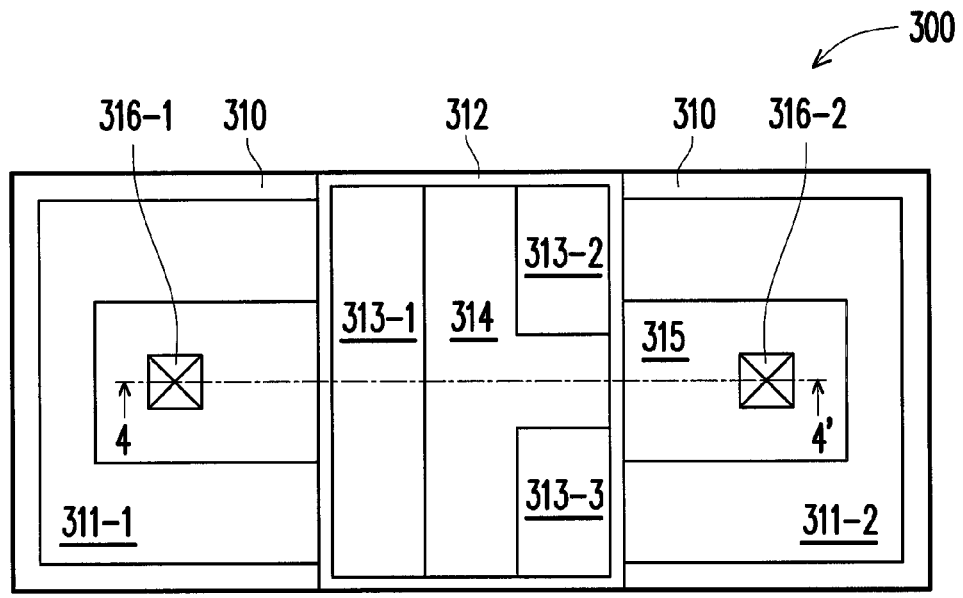
FIG. 1 is a diagram of a complimentary metal-oxide-semiconductor non-volatile memory cell according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Please refer to FIG. 1, which is a diagram of a complimentary metal-oxide-semiconductor (CMOS) non-volatile memory cell 300 (hereinafter "the memory cell 300") according to one embodiment of the present invention. The memory cell 300 may be formed over an active region 315 in a P-well region 310 of a substrate. Although P-well topology CMOS is described, the embodiments described herein are also suitable for application to N-well topology CMOS. A first N+ diffusion region 311-1 may be formed under a first polysilicon gate 313-1, and a second N+ diffusion region may be formed under a second polysilicon gate 313-2 and a third polysilicon gate 313-3.

The second polysilicon gate 313-2 and the third polysilicon gate 313-3 may be formed a first distance apart from each other. Further, the second polysilicon gate 313-2 and the third polysilicon gate 313-3 may both be formed a second distance apart from the first polysilicon gate 313-1. The first distance and the second distance may be of sizes suitable for forming self-aligning nitride (SAN) layers in a space between the first, second, and third polysilicon gates 313-1, 313-2, 313-3.

Contacts 316-1 and 316-2 may be formed in the active region 315 over the diffusion regions 311-1 and 311-2, respectively, for charging the diffusion regions 311-1, 311-2 with voltage signals applied to the contacts 316-1, 316-2. A lightly-doped drain (LDD) block region or a source/drain extension (SDE) region may also be formed in and surrounding a region of the substrate over which the first, second, and third polysilicon gates 313-1, 313-2, 313-3 and the SAN layer 314 are formed.

Figure 2:
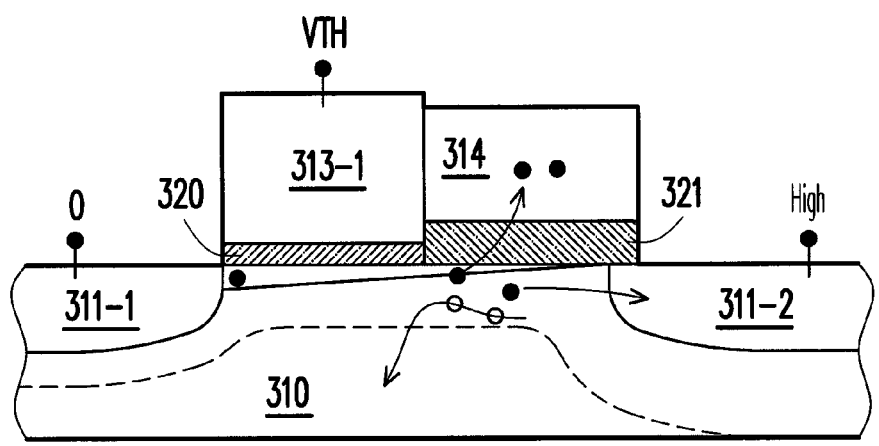
FIG. 2 is a cross-sectional diagram of the CMOS non-volatile memory cell along line 4-4' of FIG. 1 in program mode.

Please refer to FIG. 2, which is a cross-sectional diagram of the CMOS non-volatile memory cell 300 along line 4-4' of FIG. 1. FIG. 2 shows the memory cell 300 in program mode. A first oxide layer 320 may be formed between the first polysilicon gate 313-1 and the substrate. In program mode, for an N-type MOSFET, a gate voltage of approximately a threshold voltage $V_{TH}$ of the memory cell 300 may be applied to the polysilicon gate 313-1, a high voltage may be applied to the diffusion region 311-2 ("second diffusion region"), and the diffusion region 311-1 ("first diffusion region") may be grounded. In this way, channel hot electrons may travel from the first diffusion region 311-1 toward the second diffusion region 311-2 through a channel region formed between the first diffusion region 311-1 and the second diffusion region 311-2. Likewise, holes may travel from the second diffusion region 311-2 toward the P-well 310. The channel hot electrons may be injected into the SAN layer 314 through a second oxide layer 321 formed between the SAN layer 314 and the substrate.

Figure 4:
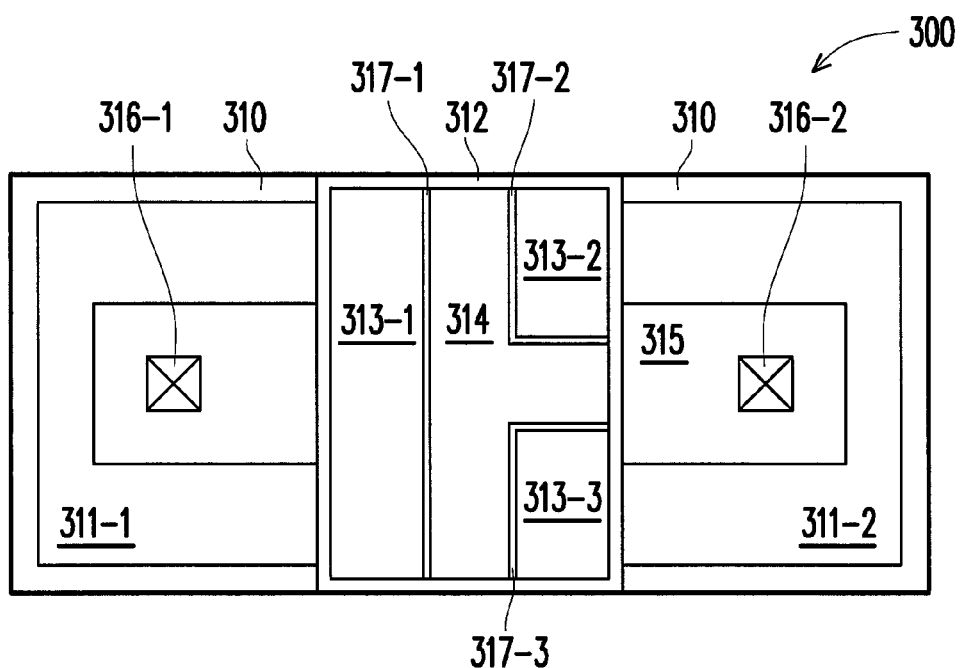
FIG. 4 is a diagram of a complimentary metal-oxide-semiconductor non-volatile memory cell showing sidewall spacers.

Addition of the second and third polysilicon gates 313-2, 313-3 may couple high voltage to sidewall spacers 317-1, 317-2, 317-3 (see FIG. 4) adjacent the SAN layer 314, which may greatly enhance channel hot electron injection efficiency. The sidewall spacers 317-1, 317-2, 317-3 may be formed of oxide grown on the substrate and the second and third polysilicon gates 313-2, 313-3. Further, the peak channel hot electron injection may be shifted to an edge of the second diffusion region 311-2 under the SAN layer 314, and current density may be enhanced by applying voltage to the second and third polysilicon gates 313-2, 313-3.

Figure 3:
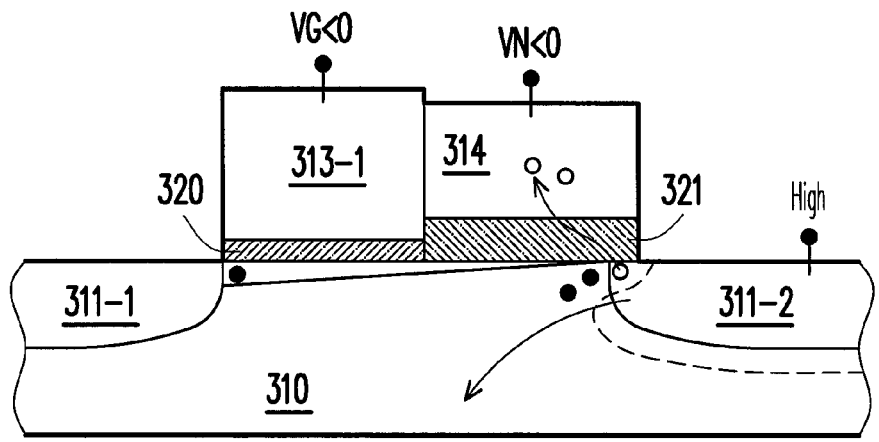
FIG. 3 is a diagram of the CMOS non-volatile memory cell of FIG. 2 in erase mode.

Please refer to FIG. 3, which is a diagram of the CMOS non-volatile memory cell 300 of FIG. 2 in erase mode. Band-to-band tunneling hot hole (BBHH) injection may be utilized to erase the memory cell 300. As shown in FIG. 3, a low voltage, e.g. <0 Volts, may be applied to the first polysilicon gate 313-1, and a SAN layer voltage VN, e.g. <0 Volts, may be coupled to the sidewall spacers 317-1, 317-2, 317-3 next to the SAN layer 314 by the second and third polysilicon gates 313-2, 313-3. A high voltage may be applied to the second diffusion region 311-2.

In this way, BBHH injection may occur, such that hot holes may travel from the second diffusion region 311-2 to the SAN layer 314 through the oxide layer 321. Likewise, electrons may travel toward the P-well 310 due to the low voltage coupled through the sidewall spacers 317-1, 317-2, 317-3 by the second and third polysilicon gates 313-2, 313-3. Thus, hot hole injection current may be enhanced due to an external vertical electric field in the sidewall spacers 317-1, 317-2, 317-3 induced through the second and third polysilicon gates 313-2, 313-3.

Thus, it can be seen that through addition of the second and third polysilicon gates 313-2, 313-3, the memory cell 300 has enhanced current density in both program and erase modes, which improves performance of the memory cell 300 over the prior art. Further, in simulation, the memory cell 300 exhibits an acceptable program/erase window under 2 Volts operation.

Figure 5:
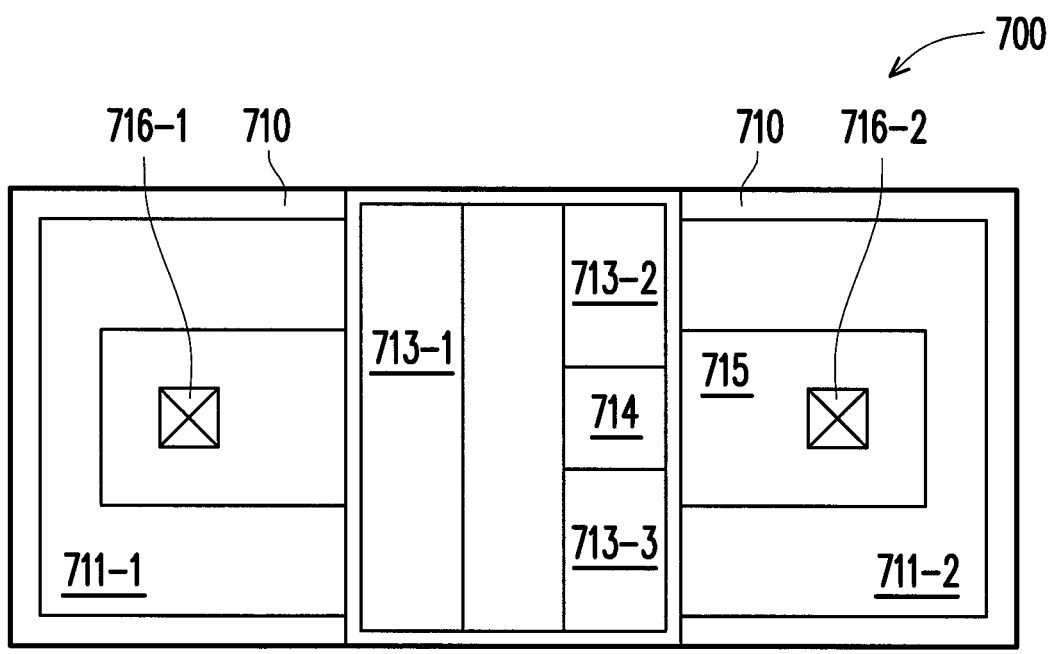
FIG. 5 is a diagram of a complimentary metal-oxide-semiconductor non-volatile memory cell according to another embodiment of the present invention.

Please refer to FIG. 5, which is a diagram of a complimentary metal-oxide-semiconductor non-volatile memory cell 700 (hereinafter "the memory cell 700") according to another embodiment of the present invention. The memory cell 700 may be formed over an active region 715 in a P-well region 710 of a substrate. A first N+ diffusion region 711-1 may be formed under a first polysilicon gate 713-1, and a second N+ diffusion region may be formed under a second polysilicon gate 713-2 and a third polysilicon gate 713-3.

The second polysilicon gate 713-2 and the third polysilicon gate 713-3 may be formed a first distance apart from each other. Further, the second polysilicon gate 713-2 and the third polysilicon gate 713-3 may both be formed a second distance apart from the first polysilicon gate 713-1. The second distance and the first distance may be measured along perpendicular axes. The first polysilicon gate 713-1 may be wider than the second and third polysilicon gates 713-2, 713-3. The first distance may be of a size suitable for forming a self-aligning nitride (SAN) layer 714 in a space between the second and third polysilicon gates 713-2, 713-3, and the second distance may be of a size suitable for not forming an SAN layer between the first polysilicon gate 713-1 and the second and third polysilicon gates 713-2, 713-3.

For example, in a 90 nm/65 nm node, a range of 20 nm to 200 nm of separation between the second and third polysilicon gates 713-2, 713-3 may allow formation of a charge storage layer 714, e.g. the SAN layer, in the space between the second and third polysilicon gates 713-2, 713-3. Contacts 716-1 and 716-2 may be formed in the active region 715 over the diffusion regions 711-1 and 711-2, respectively, for charging the diffusion regions 711-1, 711-2 with voltage signals applied to the contacts 716-1, 716-2.

Figure 6:
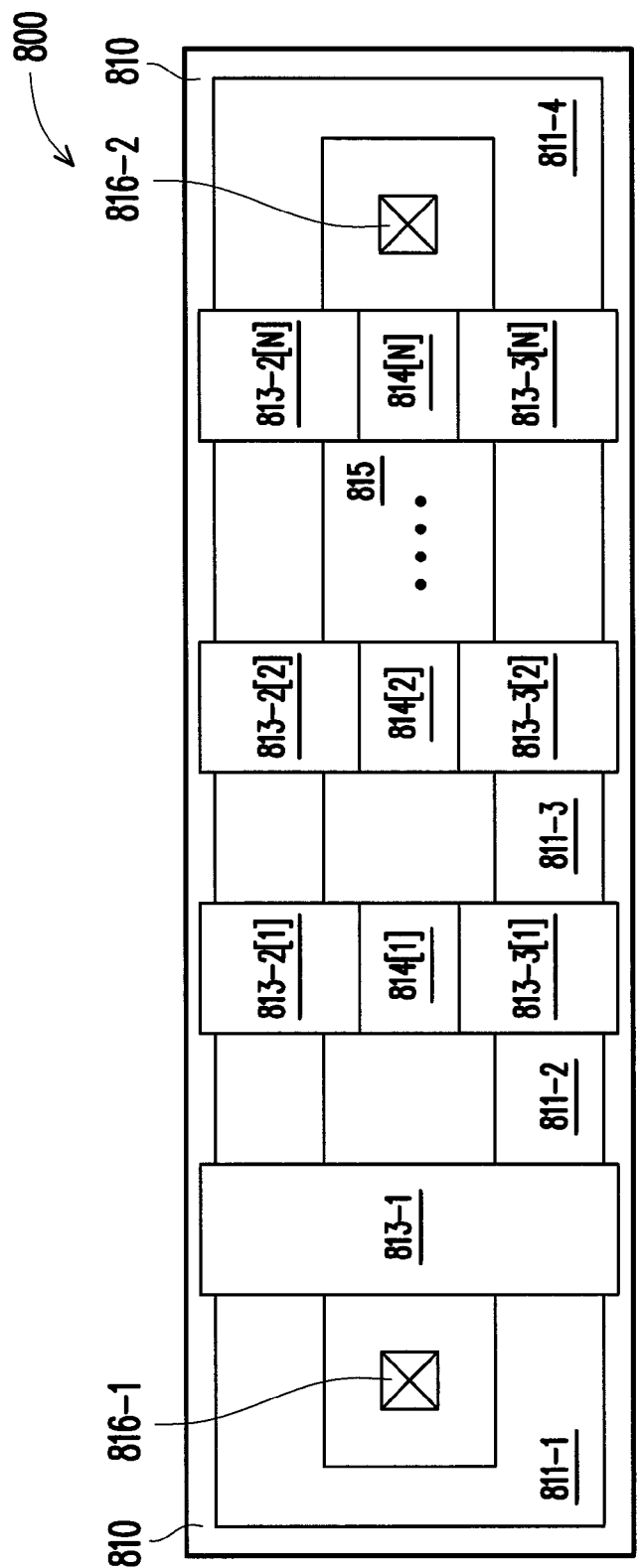
FIG. 6 is a diagram of an array of complimentary metal-oxide-semiconductor non-volatile memory cells according to an embodiment of the present invention.

Please refer to FIG. 6, which is a diagram of an array 800 of complimentary metal-oxide-semiconductor non-volatile memory cells according to an embodiment of the present invention. The array of memory cells 800 may be considered a logical NAND type array comprising a plurality of memory cells in a memory string. Each memory string may comprise a plurality of memory cells as shown in FIG. 6.

The memory cells 800 may be formed over an active region 815 in a P-well region 810 of a substrate. As shown in FIG. 6, a total number N memory cells may be formed. A first N+ diffusion region 811-1 may be formed under a first polysilicon gate 813-1. A second N+ diffusion region 811-2 may be formed under the first polysilicon gate 813-1 and second and third polysilicon gates 813-2[1], 813-3[1]. A third N+ diffusion region 811-3 may be formed under the second and third polysilicon gates 813-2[1], 813-3[1] and under fourth and fifth polysilicon gates 813-2[2], 813-3[2]. A fourth N+ diffusion region 811-4 may be formed under sixth and seventh polysilicon gates 813-2[N], 813-3 [N].

To form a continuous channel between the first N+ diffusion region 811-1 and the fourth N+ diffusion region 811-4, each charge storage layer 814[1], 814[2], . . . , 814[N] may store charges, e.g. electrons. If one or more of the charge storage layers 814[1], 814[2], . . . , 814[N] does not store charges, current may not pass from the first N+ diffusion region 811-1 to the fourth N+ diffusion region 811-4. Thus, NAND-type operation may be achieved through use of the architecture shown in FIG. 6.

The second polysilicon gate 813-2[1] and the third polysilicon gate 813-3[1] may be formed a first distance apart from each other. Further, the second polysilicon gate 813-2[1] and the third polysilicon gate 813-3[1] may both be formed a second distance apart from the first polysilicon gate 813-1. The fourth polysilicon gate 813-2[2] and the fifth polysilicon gate 813-3[2] may be formed the first distance apart from each other. The fourth polysilicon gate 813-2[2] may be formed a third distance apart from the second polysilicon gate 813-2[1]. The fifth polysilicon gate 813-3[2] may be formed the third distance apart from the third polysilicon gate 813-3 [1].

The third distance may be the same as the second distance. The first distance may be of a size suitable for forming the self-aligning nitride (SAN) layers 814[1], 814[2], . . . , 814[N] in spaces between the second and third polysilicon gates 813-2[1], 813-3[1], fourth and fifth polysilicon gates 813-2[2], 813-3[2], through the sixth and seventh polysilicon gates 813-2[N], 813-3[N]. The second distance may be of a size suitable for not forming an SAN layer between the first polysilicon gate 813-1 and the second and third polysilicon gates 813-2[1], 813-3[1].

The third distance may be of a size suitable for not forming an SAN layer between the second and third polysilicon gates 813-1[1], 813-3[1] and the fourth and fifth polysilicon gates 813-2[2], 813-3[2], respectively. For example, in a 90 nm/65 nm node, a range of 20 nm to 200 nm of separation between the second and third polysilicon gates 813-2[1], 813-3[1] may allow formation of a charge storage layer 814[1], e.g. the SAN layer, in the space between the second and third polysilicon gates 813-2[1], 813-3[1]. Contacts 816-1 and 816-2 may be formed in the active region 815 over the diffusion regions 811-1 and 811-4, respectively, for charging the diffusion regions 811-1, 811-4 with voltage signals applied to the contacts 816-1, 816-2.

The above description of FIG. 6 relates to a NAND-type array configuration. A NOR-type array configuration is also described herein as follows. A NOR-type array may comprise a plurality of memory cells, each configured as the memory cell 300 or the memory cell 700. Taking the memory cell 700 as an example, each first diffusion region 711-1 may be electrically connected to other first diffusion regions 711-1 of other memory cells of the NOR-type array, and each second diffusion region 711-2 may be electrically connected to other second diffusion regions 711-2 of the other memory cells of the NOR-type array.

In such a configuration, if one or more charge storage layers 714 corresponding to one or more memory cells of the NOR-type array is charged, forming one or more channels from the first diffusion region 711-1 to the second diffusion region 711-2 of the one or more memory cells, current may travel through the channel from the first diffusion region 711-1 to the second diffusion region 711-2. Thus, logical NOR-type operation may be accomplished in the NOR-type array.

The embodiments described above utilize a charge storage layer of a non-volatile memory unit to store charges. Then, a memory unit for multiple read and multiple programming is implemented. However, the charge storage method of the non-volatile memory unit may be changed through a different operation to implement a one time programming memory unit practically.

Figure 7:
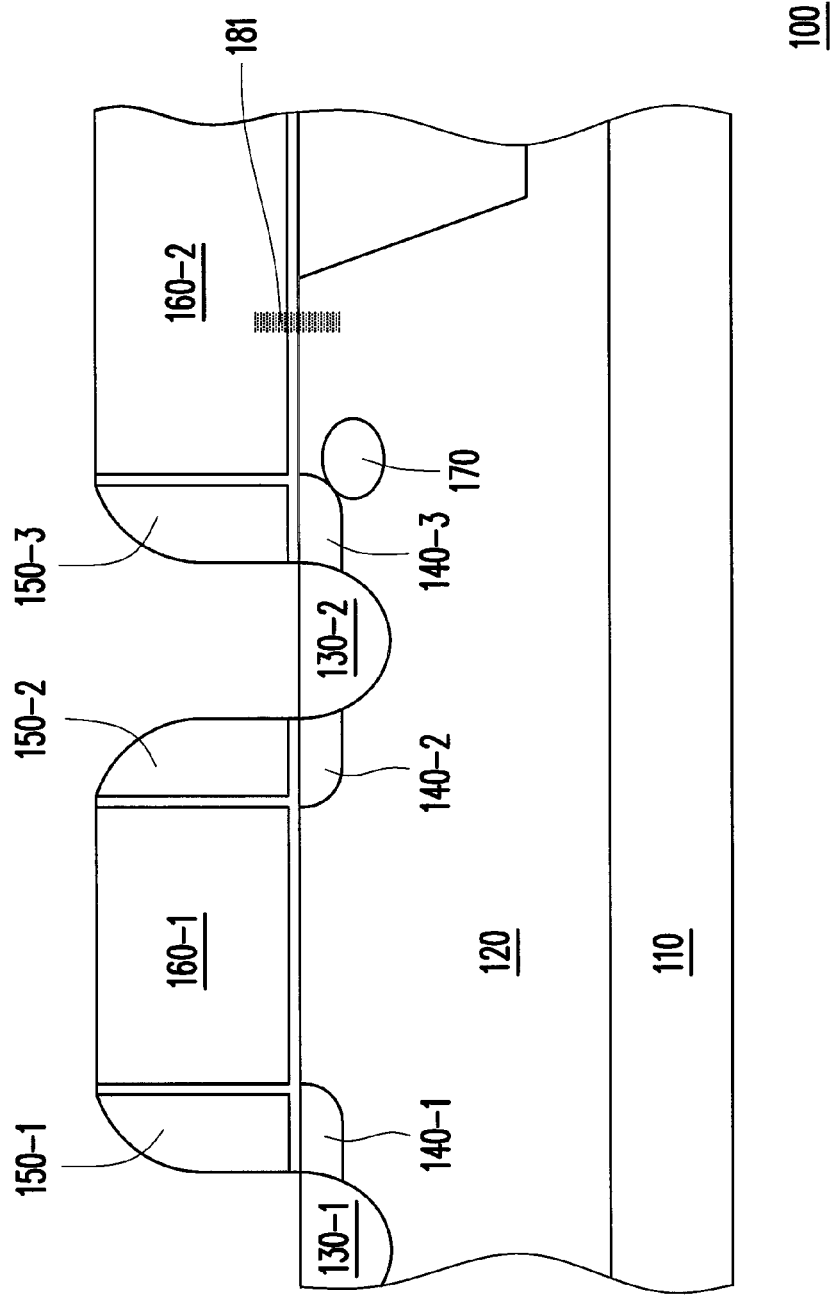
FIG. 7 shows a schematic profile of an OTP ROM unit.

Before describing the one time programming, a formed location of a conductance channel is first described below. FIG. 7 shows a schematic profile of an OTP ROM unit. Please refer to FIG. 7. The OTP ROM unit 100 includes a substrate 110, a P well region 120, N+ diffusion regions 130-1 and 130-2, N type light doped regions 140-1~140-3, sidewall spacers 150-1~150-3, a first poly gate 160-1, a second poly gate 160-2, and a doped region 170. For restraining the short channel effect, the doped region 170 is formed near the N type light doped region 140-3. Besides, as shown in FIG. 7, the programming operation of the OTP ROM unit 100 is based on the breakdown of the oxide layer of the gate to form a permanent conductance channel 181, wherein the conductance channel 181 is disposed between the second poly gate 160-2 and the P well region 120. Herein, the conductance channel 181 in this location is an ideal breakdown region.

Figure 8:
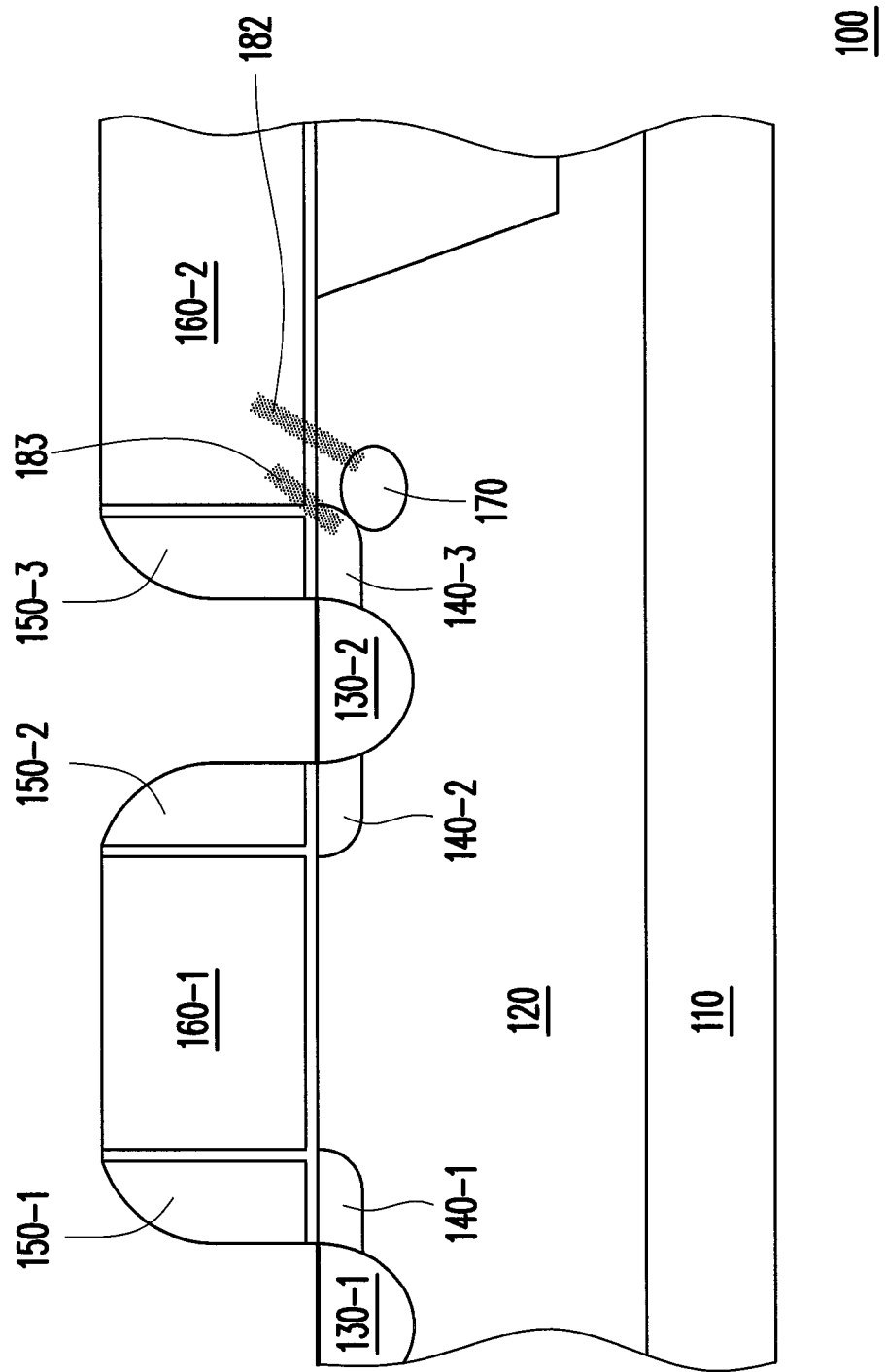
FIG. 8 shows another schematic profile of an OTP ROM unit.

Nevertheless, in a practical operation as shown in FIG. 8, the conductance channel may be formed in the location marked the number 182 and 183 which represent two kind of non-ideal states. Herein, in the first non-ideal state, the conductance channel 182 locates between the second poly gate 160-2 and the doped region 170. In addition, compared to the conductance channel 181, the conductance channel 182 includes higher impedance. Therefore, a tail bit occurs easily while reading the OTP ROM unit. Moreover, in the second non-ideal state, the conductance channel 183 is formed between the second poly gate 160-2 and the N type light doped region 140-3. Besides, compared to the conductance channel 181, conductance channel 183 includes lower impedance, so it easily couples to a bit line and cause a higher electrical current while reading the OTP ROM unit.

Figure 9:
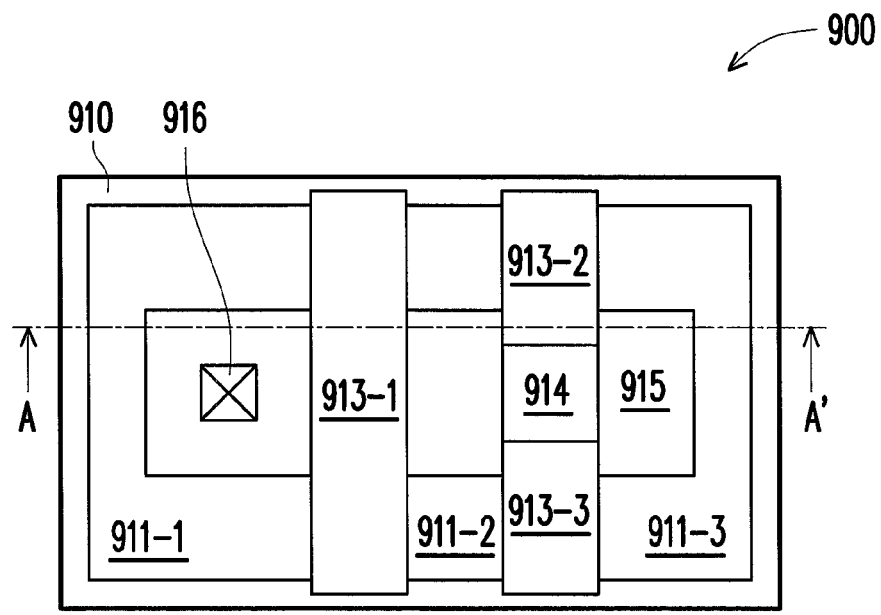
FIG. 9 is a non-volatile memory unit according to another embodiment of the invention.

To solve the above-mentioned problem, the invention employs two memory cells to store a state of a memory unit so as to decreases the erroneous judgments of the read operation of the memory unit. Take the non-volatile memory unit 800 as shown in FIG. 6 as an example. If FIG. 6 is simplified to a memory unit, the memory unit will be implemented as shown in FIG. 9. FIG. 9 is a non-volatile memory unit according to another embodiment of the invention. Please refer to FIG. 9. The non-volatile memory unit 900 includes a well region 910, a select gate 913-1, a first gate 913-2, a second gate 913-3, an oxide nitride spacer 914, a first diffusion region 911-1, a second diffusion region 911-2, a third diffusion region 911-3 and a contact 916. In addition, the well region 910 includes an active region 915. Wherein, the arrangement of location that the oxide nitride spacer 914 is relative to the gates 913-2 and 913-3 is similar to the arrangement of location that the charge storage layer 814[1] is relative to the gates 813-2[1] and 813-3[1] in FIG. 6. For example, the oxide nitride spacer 914 may be filled between the first gate 913-2 and the second gate 913-3.

As a further view of a layout construction, the select gate 913-1 is fully formed on the active region 915. The first gate 913-2 and the second gate 913-3 are partially and individually formed on the active region 915, and the first gate 913-2 and the second gate 913-3 are disposed at a first side of the select gate 913-1. The first diffusion region 911-1 is disposed at a second side of the select gate 913-1, and the second diffusion region 911-2 is disposed at the first side of the select gate 913-1. In other words, the first diffusion region 911-1 and the second diffusion region 911-2 are disposed at two sides opposite in the select gate 913-1. Similarly, the second diffusion region 911-2 and the third diffusion region 911-3 are disposed at two sides opposite in the first gate 913-2 and the second gate 913-3. The contact 916 is formed above the active region 915 on the first diffusion region 911-1.

Figure 10:
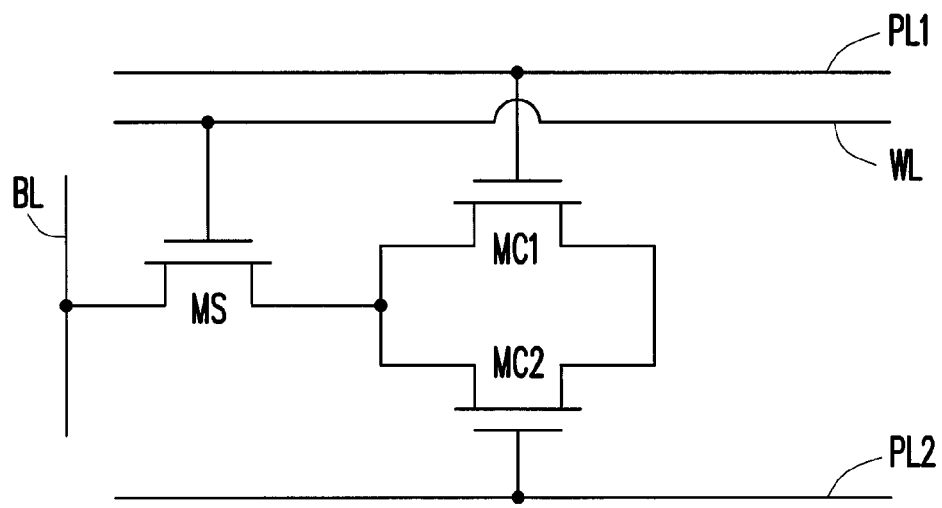
FIG. 10 is the equivalent circuit of the non-volatile memory unit 900.

The equivalent circuit of the non-volatile memory unit 900 as described in FIG. 9 is displayed in FIG. 10. Please refer to FIG. 9 and FIG. 10. Herein, the first diffusion region 911-1 and the second diffusion region 911-2 are formed individually at two sides of the select gate 913-1. Therefore, a select transistor MS is formed equivalently. Similarly, the first gate 913-2 and the second gate 913-3 are both formed between the second diffusion region 911-2 and the third diffusion region 911-3. Thus, two memory cells MC1 and MC2 which are connected in parallel are formed equivalently. Specifically, the non-volatile memory unit 900 includes a select transistor MS, a first memory cell MC1, and a second memory cell MC2. The source end of the select transistor MS is electrically connected to the drain ends of the first memory cell MC1 and the second memory cell MC2. Additionally, the source end of the first memory cell MC1 is electrically connected to the source end of the second memory cell MC2.

Besides, the drain end of the select transistor MS is electrically connected to a bit line BL, and the gate end of the select transistor MS is electrically connected to a word line WL. In addition, the gate end of the first memory cell MC1 is electrically connected to the first line PL1, and the gate end of the second memory cell MC2 is electrically connected to the second line PL2. Thus, reading and programming the non-volatile memory unit 900 are operated through the voltages from the bit line BL, the word line WL, the first line PL1, and the second line PL2.

Figure 11A:
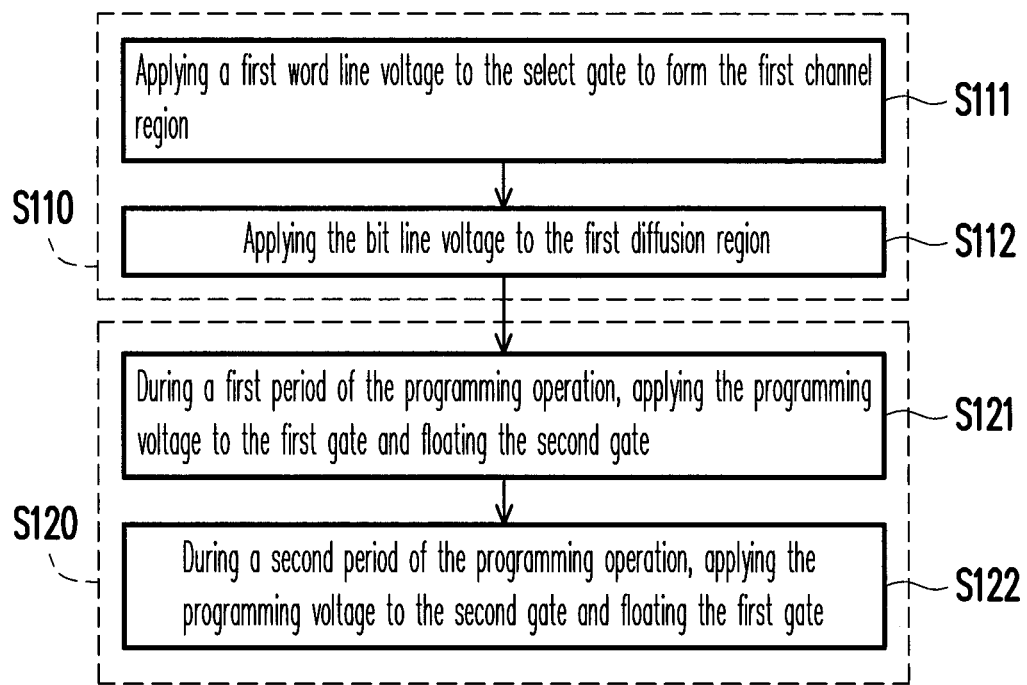
FIG. 11A shows the flow chart of the programming method of the non-volatile memory unit 900 according to an embodiment of the invention.

FIG. 11A shows the flow chart of the programming method of the non-volatile memory unit 900 according to an embodiment of the invention. Please refer to FIG. 9, FIG. 10, and FIG. 11A about the detail flow when programming the non-volatile memory unit 900. Firstly, as shown in step S110, coupling a breakdown voltage to the second diffusion region through a first channel region formed under the select gate.

Figure 11B:
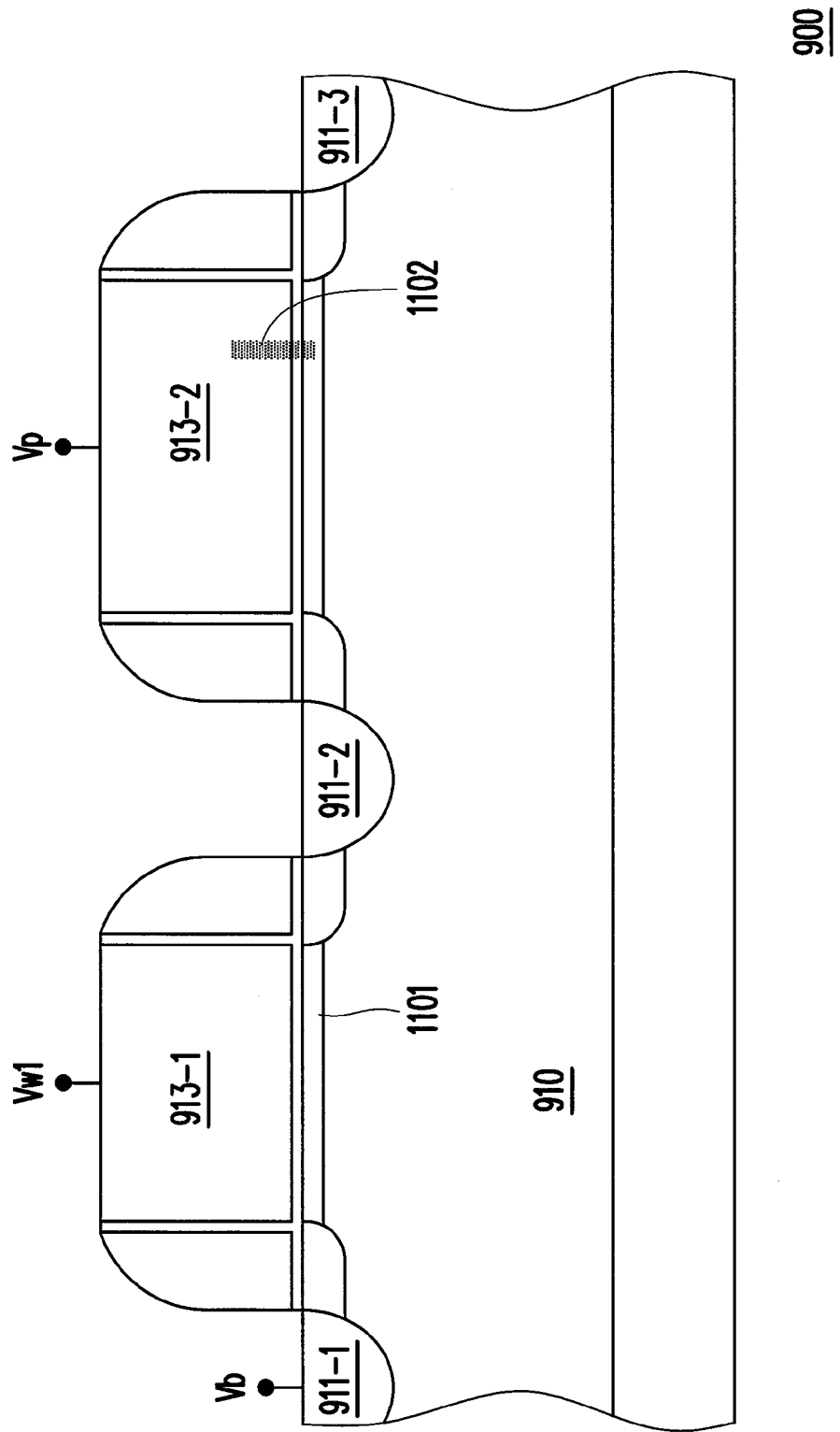
FIG. 11B shows the schematic profile of the non-volatile memory unit 900 along the line A-A'.

For example, FIG. 11B shows the schematic profile of the non-volatile memory unit 900 along the line A-A'. Please refer to FIG. 10 and FIG. 11B, the first word line voltage Vw1 is applied to the gate end of the select transistor MS through the word line WL to apply the first word line voltage Vw1 to the select gate 913-1. Besides, a bit line voltage Vb is applied to the drain end of the select transistor MS through the bit line BL, i.e applying the bit line voltage Vb to the first diffusion region 911-1. Then, the first channel region 1101 is formed under the select gate 913-1, and a breakdown voltage is hence coupled to the second diffusion region 911-2. In other words, the detail flow of step S110 includes the following steps: applying a first word line voltage to the select gate to form the first channel region (step S111) and applying a bit line voltage to the first diffusion region (step S112).

Then, as shown in step S120, apply a programming voltage to the first gate and the second gate sequentially to rupture a first oxide layer and a second oxide layer. For example, as shown in FIG. 10, during a first period of the programming operation, apply the programming voltage Vp to the gate end of the first memory cell MC1 through the first line PL1, and float the gate end of the second memory cell MC2. Thus, the first memory cell MC1 is programmed. In the meantime, as shown in FIG. 11B, the first gate 913-2 is biased under the programming voltage Vp. Besides, the voltage difference between the first gate 913-2 and the second diffusion region 911-2, that is, the voltage difference between the bit line voltage Vb and the programming voltage Vp causes the first oxide layer to be broken down, and further rupture the first oxide layer. Therefore, a conductance channel 1102 is permanently formed. Then, the bit line voltage Vb may be, for example, a ground voltage. Additionally, in a better embodiment, the programming voltage Vp is twice as the first bit voltage Vw1.

Similarly, as shown in FIG. 10, during a second period of the programming operation, the programming voltage Vp is applied to the gate end of the second memory cell MC2 through the second line PL2 and float the gate end of the first memory cell MC1 to program the second memory cell MC2. Meanwhile, the second gate 913-3 is biased under the programming voltage Vp. Besides, the voltage difference between the second gate 913-3 and the second diffusion region 911-2 causes the second oxide layer between the second gate 913-3 and the well region 910 to be ruptured and further rupture the second oxide layer. In other words, as described above, the detail flow of the step S120 includes the following steps: during a first period of the programming operation, applying the programming voltage to the first gate and floating the second gate (step S121), and during a second period of the programming operation, applying the programming voltage to the second gate and floating the first gate (step S122).

It is noteworthy that the programming method as shown in FIG. 11A is to program the first memory cell MC1 and the second memory cell MC2 individually at different time. However, the first memory cell MC1 and the second memory cell MC2 may be programmed simultaneously in practice. Herein, the most different part from FIG. 11A is to apply the programming voltage Vp to the first gate 913-2 and the second gate 913-3 at the same time. Thus, the first oxide layer and the second oxide layer are ruptured simultaneously.

Figure 12A:
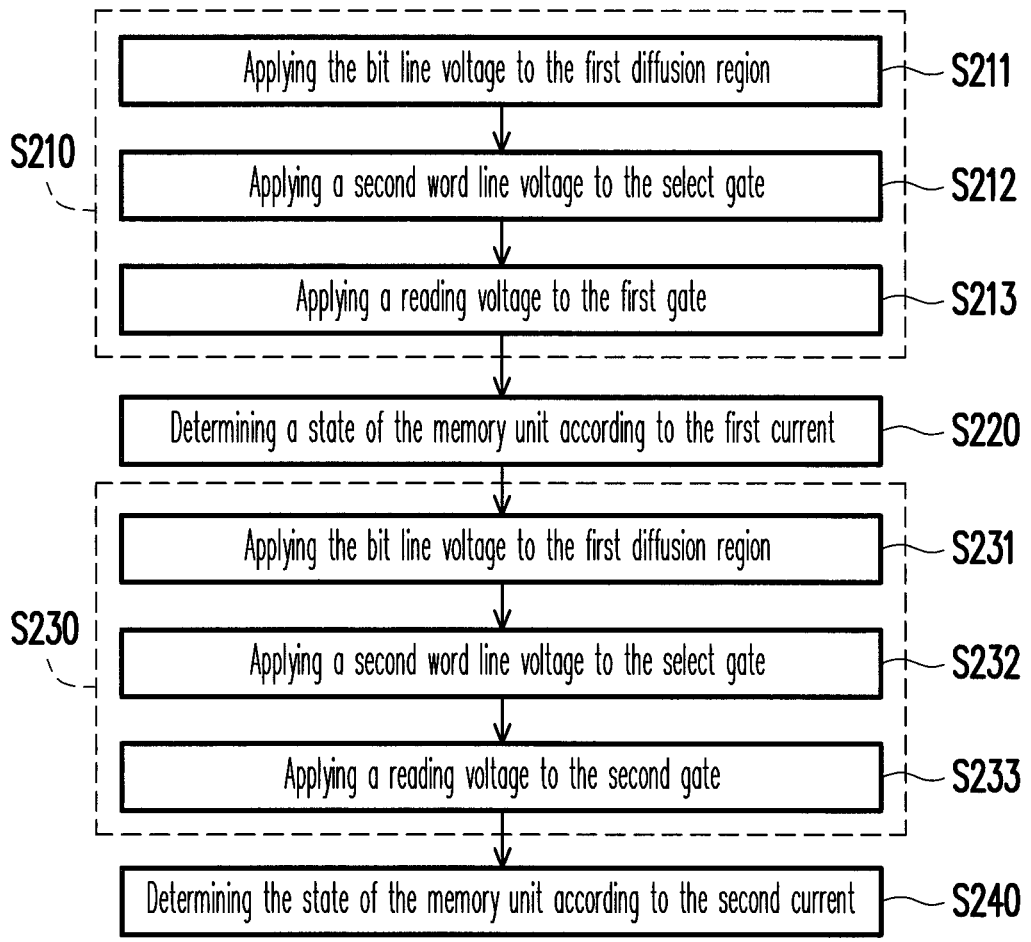
FIG. 12A shows the flow chat of the read method of the non-volatile memory unit according to an embodiment of the invention.

After programming the non-volatile memory unit 900, the conductance channel is formed between the first gate 913-2 or the second gate 913-3 and the well region 910. Therefore, the programmed memory cells generate lager electrical current than the non-programmed memory cells. In other words, the non-volatile memory unit may be determined by reading the electrical current of the memory cells. In addition, FIG. 12A shows the flow chat of the read method of the non-volatile memory unit according to an embodiment of the invention. Please refer to FIG. 9, FIG. 10, and FIG. 12A about the detail flow when reading the non-volatile memory unit 900.

Figure 12B:
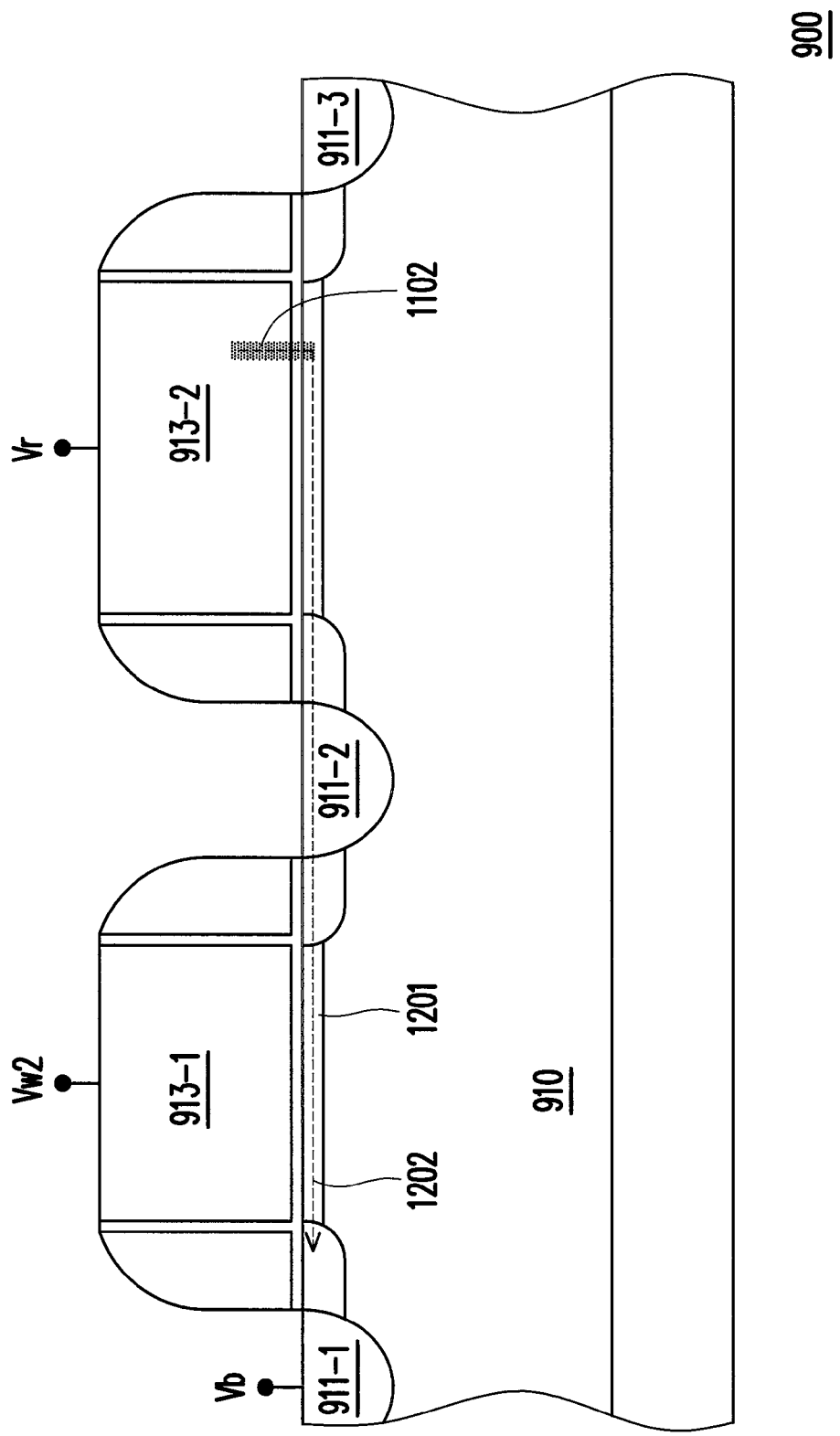
FIG. 12B shows another schematic profile of the non-volatile memory unit 900 along the line A-A'.

As shown in step S210, during a first period of a read operation, read a first current through a second channel region under the select gate. For example, FIG. 12B shows another schematic profile of the non-volatile memory unit 900 along the line A-A'. Please refer to FIG. 10 and FIG. 12B. Herein, apply a reading voltage Vr to the gate end of the first memory cell MC1 through the first line PL1, and apply the bit line voltage Vb to the drain end of the select transistor MS, and apply the second word line voltage Vw2 to the gate end of the select transistor MS through the word line WL.

Herein, as shown in FIG. 12B, the first diffusion region 911-1 is applied the bit line voltage Vb, the select gate 913-1 is applied the second word line voltage Vw2, and the first gate 913-2 is applied the reading voltage Vr. Then, the second channel region 1201 is formed under the select gate 913-1 and the first gate 913-2. Therefore, the first current 1202 from the conductance channel 1102, that is, the electrical current from the first memory cell MC1, may be read through the second channel region 1201. As mentioned above, the first current 1202 flows from the first gate 913-2 to the first diffusion region 911-1. Besides, the bit line voltage Vb may be, for example, a ground voltage. Moreover, in a better embodiment, the reading voltage Vr is equal to the second word line voltage Vw2, and the programming voltage Vp may be, for example, from twice to five times as the reading voltage Vr.

In other words, as described above, the detail flow of the step S210 includes the following steps: applying the bit line voltage to the first diffusion region (step S121), applying a second word line voltage to the select gate (step S122), and applying a reading voltage to the first gate (step S123).

When reading the first current from the first memory cell MC1 as shown in step S220, the state of memory unit 900 may be determined according to the first current. Also, since the memory unit 900 includes two memory cells, the state of memory unit 900 may be determined according to the second current of the second memory cell MC2 as shown in step S230 and step S240.

According to the step S230, during the second period of the read operation, read the second current through the third channel region under the select gate and the second gate. For example, apply the reading voltage Vr to the gate end of the second memory cell MC2, and apply the bit line voltage Vb to the drain gate of the select transistor MS, and apply the second word line voltage Vw2 to the gate end of the select transistor MS.

Meanwhile, the first diffusion region 911-1 is applied the bit line voltage Vb, the select gate 913-1 is applied the second word line voltage Vw2, and the second gate 913-3 is applied the reading voltage Vr. Thus, the third channel region is formed under the select gate 913-1 and the second gate 913-3. Therefore, the second current of the second memory cell MC2 may be read through the third channel region. In other words, as described above, the detail flow of step S230 includes the following steps: applying the bit line voltage to the first diffusion region (step S231), applying a second word line voltage to the select gate (step S232), and applying a reading voltage to the second gate (step S233). Then, in the step S240, determine the state of the memory unit 900 according to the second current.

It should be noted that the read operation of the non-volatile memory described in FIG. 12A repeatedly determines the state of memory unit 900 by reading the first current from the second channel region and the second current from the third channel region respectively. However, in a real application, the state of memory unit 900 is determined by reading a current from the second channel region and the third channel region at the same time. For example, when performing a read operation according to an embodiment of the invention, the first diffusion region 911-1 is applied the bit line voltage Vb, the select gate 913-1 is applied the second word line voltage Vw2, and the first gate 913-2 and the second gate 913-3 are applied the reading voltage Vr. Thus, the second channel region is formed under the select gate 913-1 and the first gate 913-2, and the third channel region is also formed under the select gate 913-1 and the second gate 913-3. Therefore, the current from the second channel region and the third channel region could be read and then the state of memory unit 900 is determined according to the current from the second channel region and the third channel region.

In summary, the non-volatile memory unit also can be implemented as a one time programming memory unit. In the operation of the one time programming, the invention operates the one time programming through a breakdown of an oxide layer. In addition, when programming, two oxide layers are ruptured sequentially or simultaneously in the operation method of the invention. Therefore, two memory cells are used to store as one memory unit. Then, the operation of the invention improves the success probability when programming the memory unit, and reduces the erroneous judgements when reading the memory unit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An operating method for a memory unit, the memory unit comprising a well region, a select gate, a first gate, a second gate, an oxide nitride spacer, a first diffusion region, and a second diffusion region, the well region comprising an active region, the select gate formed fully on the active region, the first gate and the second gate formed partially on the active region at a first side of the select gate, the oxide nitride spacer filled between the first gate and the second gate, the first diffusion region formed at a second side of the select gate, and the second diffusion region formed at the first side of the select gate, the operating method for the memory unit comprising:

during a programming operation, coupling a breakdown voltage to the second diffusion region through a first channel region formed under the select gate, and applying a programming voltage to the first gate and the second gate sequentially or simultaneously to rupture a first oxide layer and a second oxide layer, wherein the first oxide layer is disposed between the first gate and the well region, and the second oxide layer is disposed between the second gate and the well region.

2. The operating method for the memory unit as claimed in claim 1, wherein the step of coupling the breakdown voltage to the second diffusion region through the first channel region formed under the select gate comprises:
applying a first word line voltage to the select gate to form the first channel region; and
applying a bit line voltage to the first diffusion region.

3. The operating method for the memory unit as claimed in claim 2, wherein the programming voltage is twice as the first word line voltage.

4. The operating method for the memory unit as claimed in claim 1, wherein the step of applying the programming voltage to the first gate and the second gate sequentially comprises:
during a first period of the programming operation, applying the programming voltage to the first gate and floating the second gate; and
during a second period of the programming operation, applying the programming voltage to the second gate and floating the first gate.

5. The operating method for the memory unit as claimed in claim 1, further comprising:
during a first period of a read operation, reading a first current through a second channel region under the select gate and the first gate and determining a state of the memory unit according to the first current; and
during a second period of the read operation, reading a second current through a third channel region under the select gate and the second gate and determining the state of the memory unit according to the second current.

6. The operating method for the memory unit as claimed in claim 5, wherein the step of reading the first current through the second channel region under the select gate and the first gate comprises:
applying a bit line voltage to the first diffusion region;
applying a second word line voltage to the select gate; and
applying a reading voltage to the first gate.

7. The operating method for the memory unit as claimed in claim 6, wherein the second word line voltage is equal to the reading voltage.

8. The operating method for the memory unit as claimed in claim 5, wherein the step of reading the second current through the third channel region under the select gate and the second gate comprises:
applying a bit line voltage to the first diffusion region;
applying a second word line voltage to the select gate; and
applying a reading voltage to the second gate.

9. The operating method for the memory unit as claimed in claim 8, wherein the second word line voltage is equal to the reading voltage.

10. The operating method for the memory unit as claimed in claim 1, further comprising:
during a read operation, reading a current through a second channel region, which is under the select gate and the first gate, and a third channel region, which is under the select gate and the second gate, and determining the state of the memory unit according to the current.

11. The operating method for the memory unit as claimed in claim 10, wherein the step of reading the current through the second channel region and the third channel region comprises:
applying a bit line voltage to the first diffusion region;
applying a second word line voltage to the select gate; and
applying a reading voltage to the first gate and the second gate.

12. The operating method for the memory unit as claimed in claim 11, wherein the second word line voltage is equal to the reading voltage.

* * * * *